US008764961B2

(12) United States Patent
Luo et al.

(10) Patent No.: US 8,764,961 B2
(45) Date of Patent: Jul. 1, 2014

(54) CU SURFACE PLASMA TREATMENT TO IMPROVE GAPFILL WINDOW

(75) Inventors: Qian Luo, San Jose, CA (US); Arvind Sundarrajan, San Jose, CA (US); Hua Chung, San Jacinto, CA (US); Xianmin Tang, San Jose, CA (US); Jick M. Yu, San Jose, CA (US); Murali K. Narasimhan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 727 days.

(21) Appl. No.: 12/256,418

(22) Filed: Oct. 22, 2008

(65) Prior Publication Data

US 2010/0096273 A1    Apr. 22, 2010

(51) Int. Cl.
*C25D 5/34* (2006.01)
*C25D 7/12* (2006.01)

(52) U.S. Cl.
USPC ............................ 205/205; 205/123; 438/687

(58) Field of Classification Search
USPC .................................. 205/205; 438/677, 687
See application file for complete search history.

(56) References Cited

U.S. PATENT DOCUMENTS

| | | | |
|---|---|---|---|
| 5,837,598 A * | 11/1998 | Aronowitz et al. | 438/532 |
| 5,969,422 A | 10/1999 | Ting et al. | |
| 6,046,108 A | 4/2000 | Liu et al. | |
| 6,077,780 A | 6/2000 | Dubin | |
| 6,136,654 A * | 10/2000 | Kraft et al. | 438/287 |
| 6,228,754 B1 * | 5/2001 | Iacoponi et al. | 438/618 |
| 6,319,728 B1 * | 11/2001 | Bhan et al. | 438/687 |
| 6,331,468 B1 * | 12/2001 | Aronowitz et al. | 438/287 |
| 6,440,854 B1 * | 8/2002 | Rozbicki | 438/687 |
| 6,534,865 B1 * | 3/2003 | Lopatin et al. | 257/751 |
| 6,605,534 B1 | 8/2003 | Chung et al. | |
| 6,642,146 B1 | 11/2003 | Rozbicki et al. | |
| 6,720,248 B2 | 4/2004 | Ryo | |
| 6,727,175 B2 * | 4/2004 | Chopra | 438/659 |

(Continued)

FOREIGN PATENT DOCUMENTS

| | | |
|---|---|---|
| EP | 1533837 | 5/2005 |
| KR | 20010061516 A | 7/2001 |
| KR | 20060062926 A | 6/2006 |
| TW | 200634982 A | 10/2006 |

OTHER PUBLICATIONS

International Search Report and Written Opinion of the International Searching Authority mailed Jul. 29, 2009 in International Application No. PCT/US2009/031002.

(Continued)

*Primary Examiner* — Bryan D. Ripa
(74) *Attorney, Agent, or Firm* — Patterson & Sheridan, LLP

(57) ABSTRACT

A method and apparatus for selectively controlling deposition rate of conductive material during an electroplating process. Dopants are predominantly incorporated into a conductive seed layer on field regions of a substrate prior to filling openings in the field regions by electroplating. A substrate is positioned in one or more processing chambers, and barrier and conductive seed layers formed. A dopant precursor is provided to the chamber and ionized, with or without voltage bias. The dopant predominantly incorporates into the conductive seed layer on the field regions. Electrical conductivity of the conductive seed layer on the field regions is reduced relative to that of the conductive seed layer in the openings, resulting in low initial deposition rate of metal on the field regions during electroplating, and little or no void formation in the metal deposited in the openings.

18 Claims, 4 Drawing Sheets

(56) References Cited

U.S. PATENT DOCUMENTS

| | | | |
|---|---|---|---|
| 6,806,192 B2* | 10/2004 | Lin et al. | 438/687 |
| 6,872,657 B2* | 3/2005 | Li et al. | 438/638 |
| 7,067,424 B2* | 6/2006 | Wolters et al. | 438/687 |
| 7,247,252 B2* | 7/2007 | Pan et al. | 216/62 |
| 7,405,163 B1 | 7/2008 | Drewery et al. | |
| 7,476,618 B2 | 1/2009 | Kilpela et al. | |
| 7,879,716 B2* | 2/2011 | Barkyoumb et al. | 438/627 |
| 2003/0153101 A1* | 8/2003 | Takase et al. | 438/7 |
| 2004/0018722 A1* | 1/2004 | Tarumi et al. | 438/638 |
| 2005/0006222 A1* | 1/2005 | Ding et al. | 204/192.1 |
| 2005/0009331 A1* | 1/2005 | Park | 438/672 |
| 2005/0110147 A1* | 5/2005 | Wu et al. | 257/758 |
| 2005/0253265 A1* | 11/2005 | Barkyoumb et al. | 257/751 |
| 2006/0221353 A9 | 10/2006 | Wang | |
| 2007/0087567 A1 | 4/2007 | Lee et al. | |
| 2008/0029400 A1 | 2/2008 | Mazur | |
| 2008/0149490 A1 | 6/2008 | Bonhote et al. | |

OTHER PUBLICATIONS

Office Action for Taiwan Patent Application No. 98101438 dated Nov. 6, 2013.

* cited by examiner

CU SURFACE PLASMA TREATMENT TO IMPROVE GAPFILL WINDOW

CROSS-REFERENCE TO RELATED APPLICATIONS

This application claims benefit of U.S. Provisional Patent Application Ser. No. 61/021,259, filed Jan. 15, 2008, which is herein incorporated by reference.

BACKGROUND OF THE INVENTION

1. Field of the Invention

Embodiments of the invention relate generally to methods for processing a substrate during semiconductor manufacturing. Specifically, embodiments of the invention relate to methods of treating a conductive seed layer prior to an electrochemical deposition process.

2. Description of the Related Art

Reliably producing nanometer-sized features is one of the key technologies for the next generation of semiconductor devices. The shrinking dimensions of circuits and devices have placed additional demands on processing capabilities. The multilevel interconnects that lie at the heart of integrated circuit technology require precise processing of high aspect ratio features, such as vias and other interconnects. Reliable formation of these interconnects is very important to future success and to the continued effort to increase circuit density and quality of individual substrates.

Metallization of features formed on substrates has historically focused on various plating processes, including electroplating. A substrate having openings to be filled with metal is exposed to an electrolyte solution while a voltage bias is applied. Electrolyte reacts with the biased substrate, depositing metal thereon.

Currently, copper and copper alloys have become the metals of choice over aluminum for nanometer-sized interconnect technology. Copper has a lower electrical resistivity (about 1.7 $\mu\Omega$-cm compared to about 3.1 $\mu\Omega$-cm for aluminum), a higher current carrying capacity, and significantly higher electromigration resistance than aluminum. These characteristics are important for supporting the higher current densities experienced at high levels of integration and increased device speed. Further, copper has good thermal conductivity and is available in a highly pure form.

FIG. 1 is a structural view of a substrate 100 treated according to a prior art process. Substrate 100 has field regions 102 and openings, such as trenches 104, in the field regions. The openings are typically filled to form features having high aspect ratio geometry. Trenches 104 have been subjected to a prior art electroplating process to deposit metal 106 therein, and deposited metal covers field regions 102 as well. The prior art electroplating process has produced voids 108 in filled features deposited in the trenches 104. Voids 108 arise because as electroplating proceeds, metal deposits on the field, and on sidewalls of the openings close to the field, faster than in the bottoms of the trenches. This creates an overhang which eventually bridges across the trench, creating a void and preventing trenches from being filled with metal.

As circuit densities increase, the widths of vias, apertures, trenches, contacts, and other openings, as well as the dielectric layers between them, decrease to nanometer dimensions, whereas the thickness of the dielectric layers remain substantially constant. Therefore, the aspect ratios of the features typically increase as current densities increase. Many traditional deposition processes have difficulty filling nanometer-sized openings where the aspect ratio exceeds 4:1, and particularly where the aspect ratio exceeds 10:1. Therefore, there is much effort directed at the formation of substantially void-free, nanometer-sized features having high aspect ratio geometries.

SUMMARY OF THE INVENTION

Embodiments of the present invention generally provide a method of treating a substrate having openings in field regions, comprising depositing a conductive seed layer over the substrate, exposing the conductive seed layer to a dopant precursor in the presence of RF power, and incorporating dopants into the conductive seed layer, wherein dopants are incorporated at high concentration in the field regions and low concentration in the trenches. The dopants reduce electrical conductivity of the conductive seed layer, such that subsequent electrochemical deposition processes deposit material on field regions at a rate less than that of the openings in the field regions, resulting in little or no void formation in the features. A plasma is preferably generated by inductive coupling of the RF power, although a weak bias may also be applied.

Embodiments of the invention also provide a method of enhancing electroplating of metal components in openings formed in field regions on a substrate, comprising providing a patterned substrate, having openings in field regions, to one or more process chambers, forming a conformal barrier layer on the patterned substrate, forming a conformal conductive layer on the conformal barrier layer, treating the conformal conductive layer with a dopant precursor plasma to incorporate the dopant predominantly in the conformal conductive layer on the field regions, filling the openings in the field regions with metal by an electroplating process, and planarizing the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide methods for controlling deposition rate on a substrate in an electroplating process. A substrate having openings in field regions to be filled with metal is provided to one or more process chambers. The processes described herein may be performed in a single chamber, or in multiple chambers if desired and convenient. The substrate may be degassed, and the surface subjected to a cleaning process, prior to the plating process, if necessary. A barrier layer is deposited over the substrate surface, followed by a metal seed layer. The metal most commonly used for the seed layer and subsequent gap fill is copper (Cu), although other metals, such as aluminum, or alloys of metals may be used for gap fill or for the seed layer. Following deposition of the seed layer, the substrate surface is exposed to a plasma treatment using nitrogen gas, either substantially pure or mixed with a carrier gas such as argon or helium. Conditions of the plasma treatment are chosen such that the field areas of the substrate receive the majority of the treatment, while sidewalls and bottoms of trenches are treated only lightly or not at all. The plasma treatment selectively reduces conductivity of the field regions, resulting in slower initiation of deposition on the field regions during a subsequent process without affecting deposition rate in the openings in the field regions. Slower initiation of deposition on the field allows the openings to fill faster, and yields reduced formation of voids in the metal features.

Figure 1:
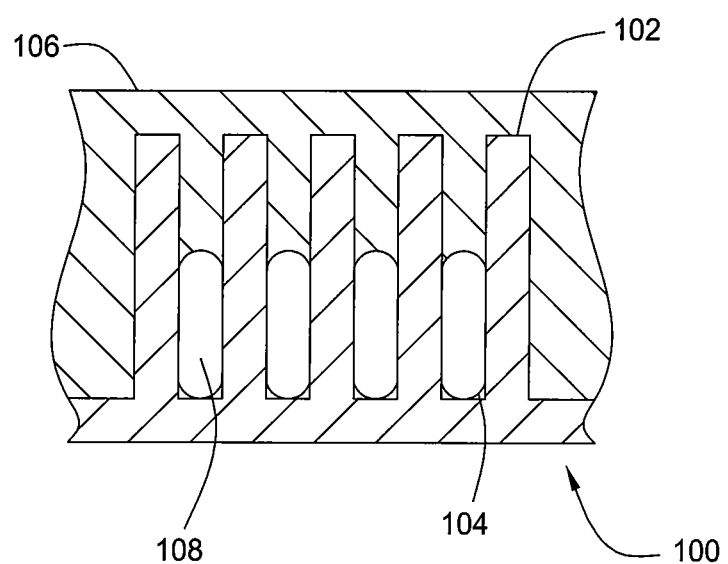
FIG. 1 is a structural view of a substrate treated according to a prior art process.
Figure 2:
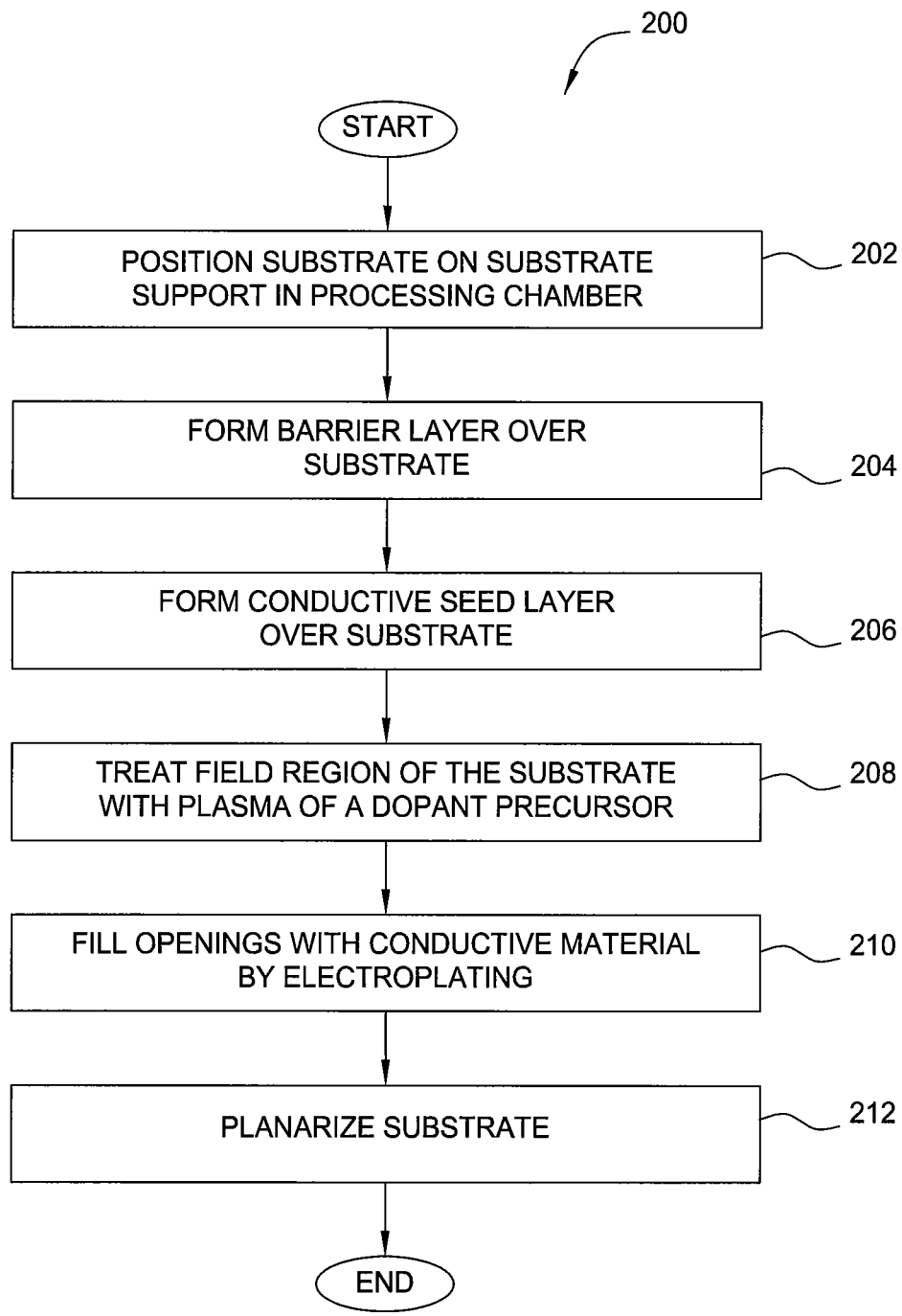
FIG. 2 is a process flow diagram according to one embodiment of the invention.

FIG. 2 is a process flow diagram illustrating a process 200 according to one embodiment of the invention. A substrate having openings in field regions, such as trenches or vias, is disposed on a substrate support in a processing chamber in step 202. A barrier layer may be deposited over a surface of the substrate in step 204. The barrier layer generally comprises a material capable of suppressing diffusion of conductive material. Some exemplary barrier materials useful for this purpose are tantalum, titanium, tantalum nitride, silicon nitride, silicon oxide, silicon oxynitrides, silicon carbide, and silicon oxycarbide. The barrier layer may be deposited by any suitable process known to the art, such as physical or chemical vapor deposition, or epitaxial processes such as atomic layer deposition, all of which may be plasma-enhanced. The barrier layer will generally be thin, having a thickness between about 100 Angstroms and 500 Angstroms.

In step 206, a conductive seed layer is deposited over the barrier layer. The conductive seed layer may be a metal or metal alloy, such as copper, aluminum, nickel, and mixtures thereof. It will provide the conductive pathway for electrochemical deposition of metal in the trenches. The conductive seed layer may be deposited by any suitable process known to the art, including the processes described above. In one embodiment, a copper seed layer may be deposited, for example, by sputtering of a copper target in an argon plasma. Other plasmas may be useful for sputtering a seed layer, such as helium and neon. The seed layer will generally be thin, having a thickness between about 100 Angstroms and about 400 Angstroms.

The substrate is subjected to a plasma treatment in step 208. The plasma treatment includes exposing the substrate to an ionized dopant precursor. The material used for plasma treatment in this embodiment is nitrogen, but other materials may be used with favorable results, such as ammonia or hydrazine. The dopant deposited by a plasma of a nitrogenous compound such as those described above, is nitrogen. Other dopants may be useful for reducing conductivity of the surface, such as carbon, boron, silicon, halogens, and lower-conductivity metals such as titanium, tin, or ruthenium may be useful dopants.

In one embodiment, a nitrogen plasma is preferred for predominantly incorporating the dopant into the surface of the conductive seed layer on the field region. A nitrogen plasma is generated by providing nitrogen gas to the process chamber, applying RF power to electrodes in the chamber to generate an oscillating electric field, and ionizing the nitrogen gas. The chamber may be maintained at a pressure of between 0.1 and 1000 milliTorr (mTorr), and RF power of between about 250 watts and about 2000 watts may be used. Although the plasma may be capacitatively or inductively coupled, no bias is applied to the substrate in this embodiment. In some embodiments, it is generally useful to generate the nitrogen plasma by applying RF power to an inductive core through which the nitrogen gas may flow. The oscillating electric field generated by current flowing around the inductive core will ionize the nitrogen gas without generating a voltage bias in the chamber, although a weak bias may be generated separately to encourage the plasma to contact the substrate more than the chamber hardware. Ions in the plasma will move toward the field regions of the substrate, and without bias will generally avoid penetrating the openings in the field regions. A weak bias generated by applying power of between about 5 and about 200 watts to a DC bias generator coupled to an electrode, such as an electrode embedded in the substrate support, or a gas distribution plate above the substrate support, will drive more ions to the substrate, but will also drive some deposition on side walls of openings in the field regions on the substrate. For this reason, if a bias is used, the bias will preferably be weak.

A doped layer is formed at the surface of the seed layer on the field region. In embodiments using a nitrogen plasma, the doped layer is a nitrogen-containing layer. A treatment of 5 seconds to 60 seconds will result in a monolayer of dopants being incorporated into the surface of the seed layer on the field region. If nitrogen is the dopant, surface concentration will be about 2 atomic percent nitrogen. If a weak bias is used to encourage faster dopant deposition, more dopant deposition may occur on the seed layer in the openings in the field regions. It is desired that dopant concentration be higher in the seed layer on the surface of the field regions than in the seed layer on the sidewalls and bottoms of the openings in the field regions. Dopant incorporation reduces conductivity at the surface of the affected regions, slowing the initial rate of deposition of conductive species during subsequent electrochemical deposition processes. Processes provided herein slow the initial rate of metal deposition on the field region during electroplating without affecting the rate of metal deposition on sidewalls or bottoms of the openings in the field regions.

It is preferred that exposure to the plasma follow formation of the seed layer without intervening exposure to oxygen. Exposure to oxygen creates a surface oxide layer that prevents subsequent dopant incorporation. An unwanted oxide layer may be removed, if necessary, by treatment with a hydrogen plasma, or it may be removed in a cleaning process before treating the seed layer with a dopant plasma.

In step 210, openings, such as trenches or vias, are filled with conductive material in an electroplating process. Because the conductivity of the doped seed layer on the field regions is reduced by incorporation of dopant, the initial deposition rate of metal on the field regions is lower than the deposition rate of metal in the openings. The openings therefore fill with metal before any overhang can develop from the field regions to block deposition in the openings. In this way a feature is formed with conductive material that is substantially free of voids. In some embodiments, the conductive material may be a metal comprising copper. To complete the process, at 212 the substrate is planarized in a planarizing process such as chemical mechanical polishing, electrochemical mechanical polishing, electropolishing, and the like.

Figure 3:
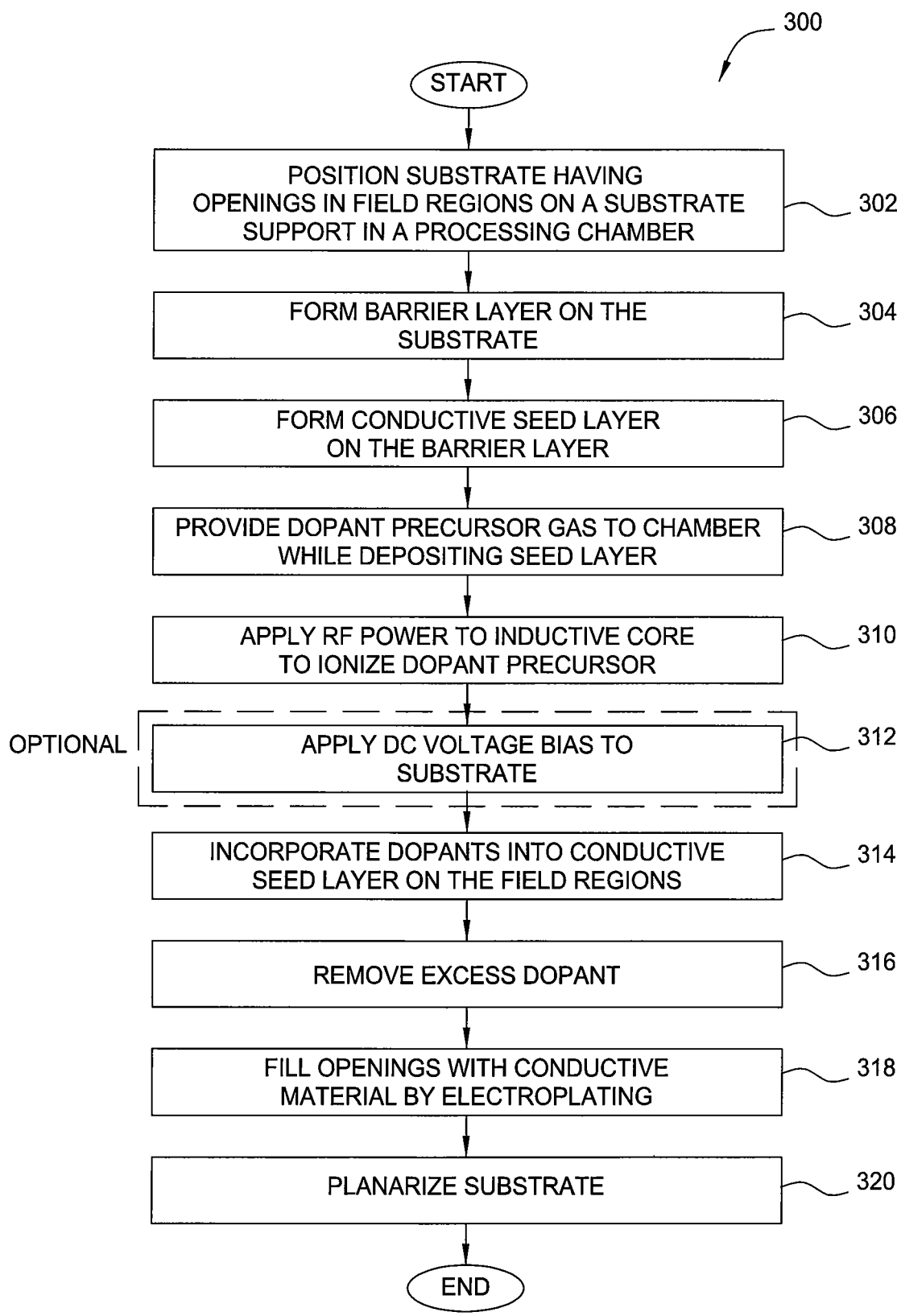
FIG. 3 is a process flow diagram according to another embodiment of the invention.

FIG. 3 is a process flow diagram illustrating a process 300 according to another embodiment of the invention. A substrate is positioned in a processing chamber, and barrier and seed layers are formed in steps 302-306. In step 308, a dopant precursor gas is provided to the process chamber at the same time the conductive seed layer is being deposited. The precursor gas is ionized into a plasma in step 310. At the same time the conductive seed layer is forming on the substrate surface, the dopant is predominantly incorporated into the surface in the field region. The conductive materials being deposited by sputtering will deposit conformally because they deposit as neutral particles, and thus are not selectively attracted to field regions, whereas the charged plasma particles will deposit preferentially on the field regions. The plasma treatment may overlap a portion of the seed layer formation step, such as the end of the seed layer step.

In step 312, an optional weak DC voltage bias may be applied to a substrate support electrode or an overhead electrode located above the substrate support. The bias will encourage plasma ions to deposit on the field regions of the substrate faster, but will drive more ions into the openings to deposit on the sidewalls of the openings. In this embodiment, the power level of the bias is less than about 200 watts.

After dopant is incorporated into the seed layer on the field regions of the substrate in step 314, the substrate may be subjected to a post-treatment in step 316 to remove any excess dopant that may have been deposited. This may be a thermal treatment to volatilize dopants, or it may be a chemical or plasma etching process or a chemical or plasma cleaning process.

In step 318, the openings are filled by electroplating. Modification of the surface of the field region in the foregoing steps increases the resistivity of the field regions, such that the initial plating rate in those regions is slow compared to that of the openings in the field regions. With little plating initially on the field, no overhang develops over the openings, which fill with metal expeditiously. Following metallization, the substrate is polished in step 320 to planarize the surface.

Figure 4:
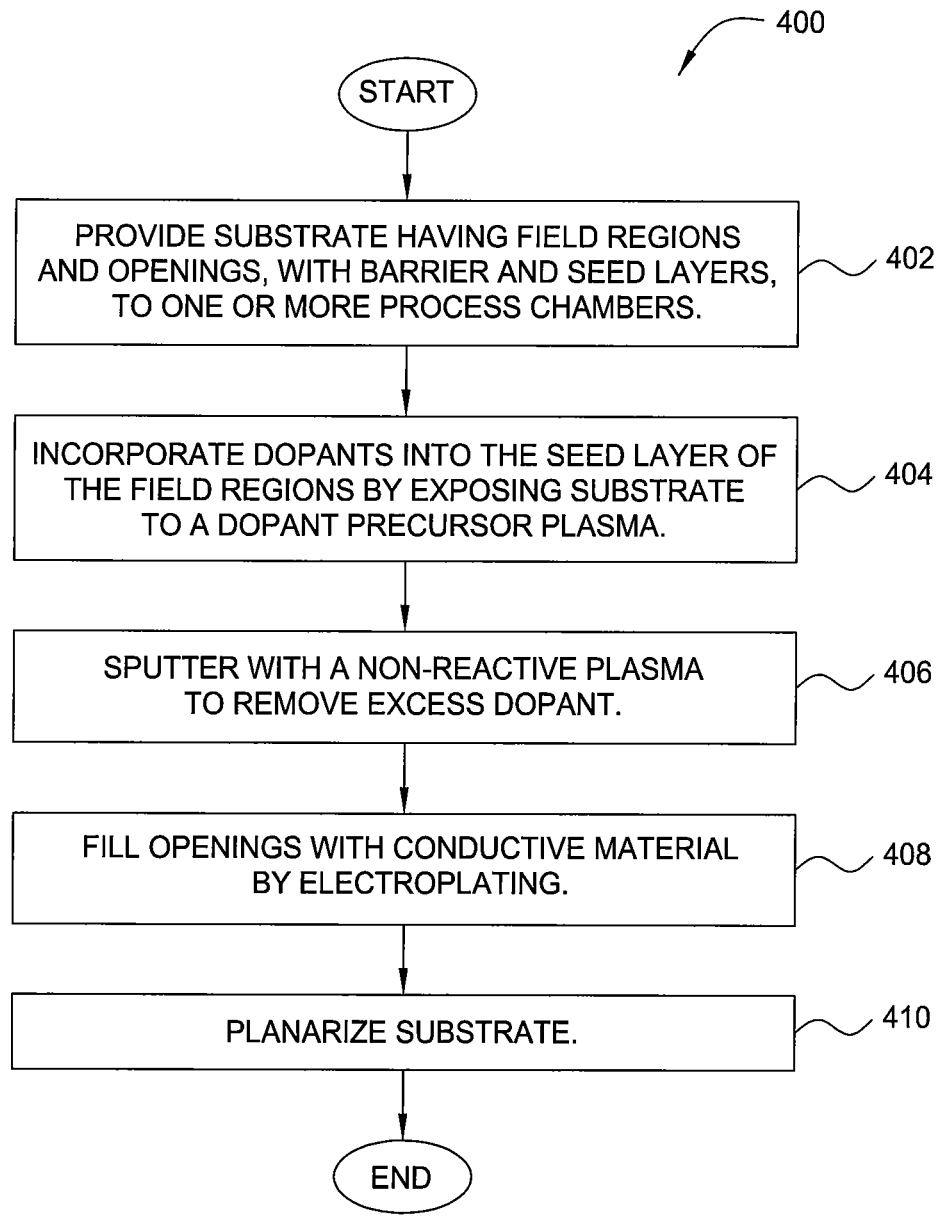
FIG. 4 is a process flow diagram according to another embodiment of the invention.

FIG. 4 is a process flow diagram illustrating another embodiment of the invention. Process 400 begins in step 402 with developing a substrate having field regions, openings in the field regions, barrier layer, and seed layer as described above. The substrate may then be exposed to a dopant precursor plasma in step 404 to incorporate dopants predominantly into the surface of the seed layer on the field regions of the substrate. In some embodiments, excess dopant may be incorporated. The excess dopant may be removed by a step such as step 406, wherein the substrate is sputtered with a non-reactive plasma, such as argon or helium, to remove excess dopant. The plasma sputtering results in a physical removal of dopants from the surface by collision of energetic but non-reactive ions from the plasma. After removing excess dopant, openings in the field regions may be filled by electroplating at 408. As described above, the dopant incorporated into the surface of the seed layer on the field regions slows the initial rate of metal deposition on the field regions relative to that in the openings in the field regions. Following the electroplating process, the substrate may be planarized at 410 by any suitable process, including those mentioned above.

Table 1 lists process conditions for individual seed layer surface treatment processes performed by the inventors prior to filling features with metal:

| Example | Precursor | Flow Rate (sccm) | RF Power (Watts) | Pressure (mTorr) | Time (sec) |
|---|---|---|---|---|---|
| 1 | $N_2$ gas | 200 | 1000 | 50 | 10 |
| 2 | $N_2$:Ar 2:1 by Volume | 200 | 1000 | 50 | 10 |
| 3 | $N_2$ gas | 200 | 500 | 50 | 20 |

In each case, a void-free gap fill was achieved due to the reduction in initial conductivity of the field region by incorporation of conductivity-reducing dopants in the surface.

While the foregoing is directed to embodiments of the invention, other and further embodiments of the invention may be devised without departing from the basic scope thereof, and the scope thereof is determined by the claims that follow.

What is claimed is:

1. A method of controlling the rate of an electrochemical deposition process in openings formed in the field regions on a substrate, sequentially comprising:
    depositing a conductive seed layer in the openings and on the field regions of the substrate;
    exposing the substrate to a nitrogen-containing plasma to incorporate nitrogen into a surface of the conductive seed layer on the field regions, wherein the concentration of nitrogen incorporated into the surface of the conductive seed layer on the field regions is higher than a concentration of nitrogen incorporated into the conductive seed layer in the openings, and wherein the substrate has a weak bias of between about 5 W and 200 W; and
    performing a post-treatment to remove excess dopant.

2. The method of claim 1, wherein the nitrogen-containing plasma comprises a plasma of nitrogen gas.

3. The method of claim 1, wherein the conductive seed layer comprises a metal.

4. The method of claim 3, wherein the metal comprises copper.

5. A method of enhancing electroplating of metal components in openings formed in field regions on a substrate, sequentially comprising:
    providing a patterned substrate, having openings in field regions, to one or more process chambers;
    forming a conformal barrier layer on the patterned substrate;
    forming a conformal conductive layer on the conformal barrier layer;
    treating the conformal conductive layer with a dopant precursor plasma to incorporate a dopant predominantly in a surface of the conformal conductive layer on the field regions, wherein the substrate has a weak bias of between about 5 W and 200 W, and wherein the dopant is deposited at high concentration on the field regions and low concentration in the openings in the field regions;
    performing a post-treatment to remove excess dopant;
    filling the openings in the field regions with metal by an electroplating process; and
    planarizing the substrate.

6. The method of claim 5, wherein the dopant reduces the conductivity of the conductive seed layer on the substrate surface.

7. The method of claim 6, wherein the dopant is nitrogen.

8. A method of filling one or more openings in a substrate with conductive material, sequentially comprising:

forming a conformal conductive layer over the substrate by depositing a first conductive material in a conformal deposition process;

reducing the initial conductivity of a portion of the conformal conductive layer formed over a field region of the substrate by selectively incorporating conductivity-reducing components into a surface of the conformal conductive layer formed over the field region of the substrate, wherein the substrate has a weak bias of between about 5 W and 200 W, and wherein the conductivity-reducing components are deposited at high concentration on the field regions and low concentration in the openings in the field regions;

performing a post-treatment to remove excess conductivity-reducing components; and filling the one or more openings with a second conductive material in an electrochemical process.

9. The method of claim 8, wherein incorporating conductivity-reducing components into the surface of the conformal conductive layer comprises exposing the substrate to a dopant precursor plasma.

10. The method of claim 8, wherein incorporating conductivity-reducing components into the surface of the conformal conductive layer comprises exposing the substrate to a nitrogen containing plasma.

11. The method of claim 8, further comprising removing excess conductivity-reducing components incorporated into the surface of the conformal conductive layer.

12. The method of claim 10, wherein incorporating conductivity-reducing components into the surface of the conformal conductive layer comprises selectively depositing a dopant monolayer on the surface of the conformal conductive layer formed over the field region of the substrate.

13. The method of claim 12, wherein selectively depositing the dopant monolayer comprises providing a dopant precursor to a processing chamber housing the substrate and generating a plasma by applying RF power to the dopant precursor.

14. The method of claim 12, wherein the dopant comprises nitrogen.

15. The method of claim 8, wherein the electrical bias to the plasma is a DC bias with a power level between about 5 watts and about 200 watts.

16. The method of claim 8, wherein incorporating conductivity-reducing components into the surface of the conformal conductive layer comprises exposing the substrate to a plasma containing dopants for a treatment of 5 seconds to 60 seconds.

17. The method of claim 16, wherein the plasma is formed by providing nitrogen gas to a process chamber housing the substrate and applying RF power between about 250 watts and about 2000 watts to the nitrogen gas.

18. The method of claim 8, further comprising forming a barrier layer over the substrate.

* * * * *

UNITED STATES PATENT AND TRADEMARK OFFICE
CERTIFICATE OF CORRECTION

PATENT NO. : 8,764,961 B2  Page 1 of 1
APPLICATION NO. : 12/256418
DATED : July 1, 2014
INVENTOR(S) : Luo et al.

It is certified that error appears in the above-identified patent and that said Letters Patent is hereby corrected as shown below:

Title Page, Related U.S. Application Data (60):

Please insert --Provisional application No. 61/021,259, filed on Jan. 15, 2008--.

Signed and Sealed this
Third Day of March, 2015

Michelle K. Lee
*Deputy Director of the United States Patent and Trademark Office*